(12) United States Patent
Iisaka et al.

(10) Patent No.: US 10,555,450 B2
(45) Date of Patent: Feb. 4, 2020

(54) ROTARY HEAD TYPE COMPONENT MOUNTER

(71) Applicant: FUJI CORPORATION, Chiryu-shi (JP)

(72) Inventors: Jun Iisaka, Nisshin (JP); Hidetoshi Ito, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 346 days.

(21) Appl. No.: 15/523,754

(22) PCT Filed: Nov. 7, 2014

(86) PCT No.: PCT/JP2014/079579
§ 371 (c)(1),
(2) Date: May 2, 2017

(87) PCT Pub. No.: WO2016/072014
PCT Pub. Date: May 12, 2016

(65) Prior Publication Data
US 2017/0325369 A1 Nov. 9, 2017

(51) Int. Cl.
*H05K 13/04* (2006.01)
*H05K 13/08* (2006.01)

(52) U.S. Cl.
CPC ......... *H05K 13/043* (2013.01); *H05K 13/041* (2018.08); *H05K 13/0409* (2018.08); *H05K 13/08* (2013.01)

(58) Field of Classification Search
CPC ............................. H05K 13/043; H05K 13/08
See application file for complete search history.

(56) References Cited

U.S. PATENT DOCUMENTS

| 7,020,956 B2 * | 4/2006 | Kuribayashi | ...... H05K 13/0417 |
| | | | 29/832 |
| 7,966,718 B2 * | 6/2011 | Kodama | ................ H05K 13/04 |
| | | | 29/739 |

(Continued)

FOREIGN PATENT DOCUMENTS

| CN | 1784141 A | 6/2006 |
| CN | 102638964 A | 8/2012 |

(Continued)

OTHER PUBLICATIONS

Extended European Search Report dated May 28, 2018 in European Patent Application No. 14905311.8, 8 pages.

(Continued)

*Primary Examiner* — Carl J Arbes
(74) *Attorney, Agent, or Firm* — Oblon, McClelland, Maier & Neustadt, L.L.P.

(57) ABSTRACT

In rotary head type component mounter, provided at two locations around rotary head are Z1-axis drive mechanism and Z2-axis drive mechanism that lower suction nozzles, and in a case in which the interval between two suction nozzles is a multiple two times or greater than the arrangement pitch of components in tray, component mounter performs consecutive simultaneous pickup operation repeatedly for a quantity corresponding to the quantity of component arrangement pitches between the two suction nozzles, the consecutive simultaneous pickup operation being that of lowering the two suction nozzles simultaneously such that two of the components on tray are picked up simultaneously, then rotating rotary head by one nozzle pitch, moving rotary head in the arrangement direction of the components on tray by one component arrangement pitch, and then lowering the next two suction nozzles simultane- (Continued)

ously such that another two of the components on tray are picked up simultaneously.

4 Claims, 11 Drawing Sheets

(56) References Cited

U.S. PATENT DOCUMENTS

| | | | |
|---|---|---|---|
| 9,204,586 B2 * | 12/2015 | Kato | H05K 13/0452 |
| 2002/0029468 A1 * | 3/2002 | Koike | H05K 13/0413 29/832 |
| 2006/0112545 A1 | 6/2006 | Hwang | |
| 2011/0302776 A1 * | 12/2011 | Kato | H05K 13/0452 29/829 |

FOREIGN PATENT DOCUMENTS

| JP | 06-342998 A | * | 12/1994 |
|---|---|---|---|
| JP | 08-010798 B | * | 1/1996 |
| JP | 2854195 B | * | 2/1999 |
| JP | 3123818 B | * | 1/2001 |
| JP | 2004-311599 A | * | 11/2004 |
| JP | 2005-286171 A | | 10/2005 |
| JP | 2006-324395 A | | 11/2006 |
| JP | 2008-108776 A | | 5/2008 |
| JP | 4405310 B | * | 1/2010 |
| JP | 2011-249704 A | | 12/2011 |
| JP | 2012-164881 A | | 8/2012 |
| JP | 2013-38358 A | | 2/2013 |
| WO | WO 2013/140600 A1 | | 9/2013 |

OTHER PUBLICATIONS

Office Action dated Aug. 20, 2018 in Japanese Patent Application No. 2016-557423 with English translation.
International Search Report dated Dec. 16, 2014, in PCT/JP2014/079579 filed Nov. 7, 2014.

* cited by examiner

ROTARY HEAD TYPE COMPONENT MOUNTER

TECHNICAL FIELD

The present application relates to a rotary head type component mounter that uses multiple suction nozzles to pick up multiple components from a tray supplied by a tray feeder.

BACKGROUND ART

In the rotary head type mounters disclosed in patent literature 1 (JP-A-2005-286171) and patent literature 2 (JP-A-2012-164881), multiple components supplied by multiple tape feeders are picked up simultaneously using multiple suction nozzles.

In particular, with patent literature 1, two suction nozzles each of two rotary heads provided in a line, that is, a total of four suction nozzles, are lowered simultaneously and pick up four components simultaneously.

On the other hand, with patent literature 2, two ring-shaped rotation bodies, an inner and outer rotation body, that rotate independently around a shared rotation axis line are provided, and multiple suction nozzles are held by each of the rotation bodies, and two suction nozzles each of the inner and outer rotation bodies, that is, a total of four suction nozzles, are lowered simultaneously and pick up four components simultaneously.

CITATION LIST

Patent Literature

Patent Literature 1: JP-A-2005-286171
Patent literature 2: JP-A-2012-164881

SUMMARY

However, the rotary head type component mounters disclosed in both patent literature 1 and 2 above suffer from having a complex head configuration due to a configuration using two heads (rotation bodies) for picking up multiple components simultaneously. Further, the technology relates to simultaneously picking up multiple components supplied by multiple tape feeders, and does not relate to simultaneously picking up multiple components from a tray supplied by a tray feeder.

Therefore, the problem solved by the present disclosure is that of simultaneously picking up multiple components from a tray supplied by a tray feeder without requiring a more complex rotary head configuration for performing simultaneous pickup operation.

To solve the above problems, the present disclosure is a rotary head type component mounter including: a tray feeder configured to supply a tray loaded with components; a rotary head configured to hold a specified quantity of suction nozzles separated in a circumferential direction by a specified nozzle pitch; a head rotating mechanism configured to revolve the specified quantity of suction nozzles in a rotating direction of the rotary head by rotating the rotary head; a Z-axis drive mechanism configured to lower the suction nozzle positioned above the tray such that the suction nozzle picks up the component on the tray; a head moving mechanism configured to move the rotary head in an XY direction between a component pickup station at which component pickup is performed and a component mounting station at which component mounting is performed; a control device configured to control operation of the head rotating mechanism, the Z-axis drive mechanism, and the head moving mechanism; and a component pickup position correction system, wherein multiple of the Z-axis drive mechanisms are provided, the multiple Z-axis drive mechanisms being configured such that multiple of the specified quantity of suction nozzles of the rotary head can be lowered simultaneously, and the control device simultaneously lowers multiple of the suction nozzles positioned above the tray using the Z-axis drive mechanisms such that multiple of the components on the tray are picked up simultaneously. According to this configuration, it is possible to simultaneously pick up multiple components from a tray supplied by a tray feeder using a rotary head with a conventional configuration without requiring a more complex rotary head configuration for performing simultaneous pickup operation.

The present disclosure may further include: an image recognizing device configured to recognize the component by image processing an image captured of the component on the tray; a component arrangement skew angle measuring device configured to measure an arrangement skew angle of the component on the tray based on a recognition result of the image recognizing device; and a component pickup position correcting device configured to correct a pickup position of the component on the tray according to the arrangement skew angle of the component on the tray measured by the component arrangement skew angle measuring device, and the control device may be configured to perform component pickup operation after correcting the position of the suction nozzle by performing rotation operation of the rotary head using the head rotating mechanism according to the component pickup position corrected by the component pickup position correcting device. In this manner, in a case in which the tray is set in a skewed manner and the arrangement of the components on the tray is skewed, it is possible to correct the pickup position of the component on the tray according to the skew angle, and thus it is possible to prevent a component pickup problem or component pickup orientation error (such as a tombstoned pickup or slanted pickup) caused by a skewed arrangement of components on the tray.

Further, the present disclosure may be configured such that the Z-axis drive mechanism is provided at two locations around the rotary head, the two Z-axis drive mechanisms being configured to lower two suction nozzles simultaneously, and an interval between the two suction nozzles being a multiple of an arrangement pitch of the components on the tray, and the control device (1) in a case in which the interval between the suction nozzles is a multiple that is two times or greater than the arrangement pitch of the components on the tray, after performing consecutive simultaneous pickup operation repeatedly for a quantity corresponding to the quantity of component arrangement pitches between the two suction nozzles, the consecutive simultaneous pickup operation being that of lowering the two suction nozzles simultaneously such that two of the components on the tray are picked up simultaneously, then rotating the rotary head by one nozzle pitch using the head rotating mechanism, moving the rotary head in the arrangement direction of the components on the tray by one component arrangement pitch using the head moving mechanism, and then lowering the next two suction nozzles simultaneously such that another two of the components on the tray are picked up simultaneously, repeats operation of moving the rotary head in the arrangement direction of the components on the tray by the interval between the two suction nozzles+one component arrangement pitch, and rotating the rotary head before the next two suction nozzles have been moved above another two of the components on the tray; and (2) in a case in which the interval between the two suction nozzles is the same as the arrangement pitch of the components on the tray, repeats operation of lowering the two suction nozzles simultaneously such that two of the components on the tray are picked up simultaneously, then rotating the rotary head by two nozzle pitches using the head rotating mechanism, moving the rotary head in the arrangement direction of the components on the tray by two component arrangement pitches using the rotary head moving mechanism, and lowering the next two suction nozzles such that two other of the components on the tray are picked up. Accordingly, it is possible to shorten the moving distance of the rotary head during component pickup operation, contributing to faster component pickup operation.

Further, the present disclosure may be configured to be able to select from a simultaneous pickup mode in which multiple suction nozzles are lowered simultaneously such that multiple of the components on the tray are picked up simultaneously, and an individual pickup mode in which the suction nozzles of the rotary head are lowered in a specified order so as to pick up components on the tray one by one, wherein the control device selects the simultaneous pickup mode such that multiple of the components on the tray are picked up simultaneously in a case in which it is determined that simultaneous pickup of multiple components on the tray is possible, and selects the individual pickup mode such that the suction nozzles of the rotary head are lowered in the specified order so as to pick up components on the tray one by one in a case in which it is determined that simultaneous pickup of multiple components on the tray is not possible. Accordingly, it is possible to use trays for various component types that have different component arrangement pitches. Note that, switching between simultaneous pickup mode and individual pickup mode may be performed by manual operation of an operator, or may be performed automatically.

DESCRIPTION OF EMBODIMENTS

Figure 1:
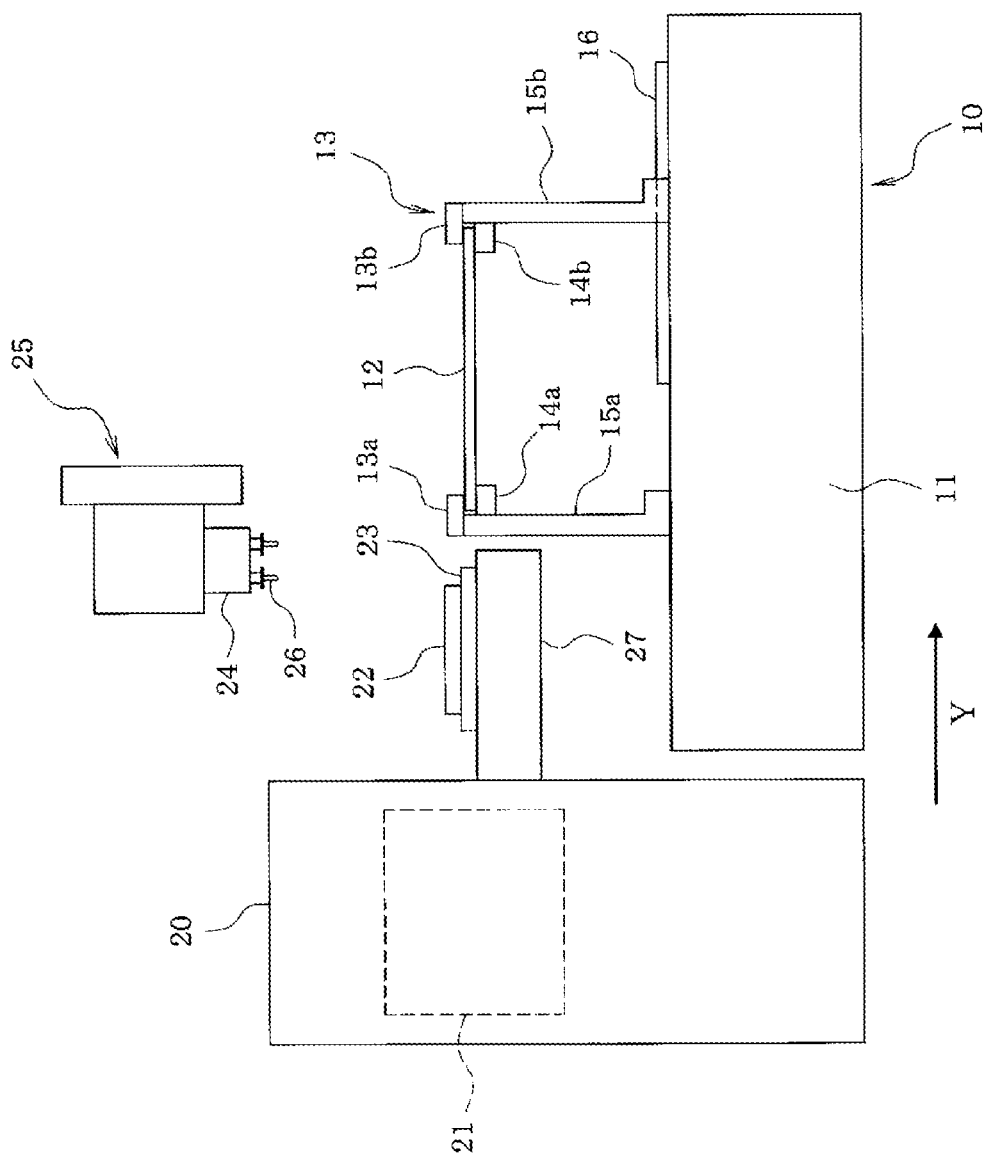
FIG. 1 is a side view of a rotary head type component mounter that is an embodiment of the present disclosure.
Figure 2:
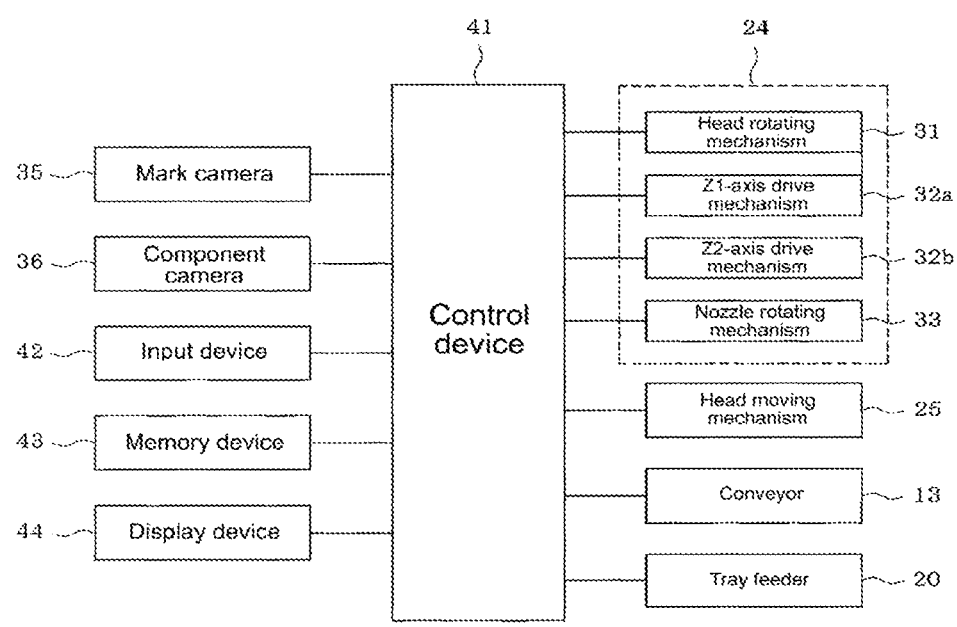
FIG. 2 is a block diagram showing the configuration of control items of the component mounter.

Embodiments of the present disclosure are described below. First, the configuration of rotary head type component mounter 10 is described based on FIGS. 1 and 2.

Conveyor 13 that conveys circuit board 12 is provided on base 11 of rotary head type component mounter 10 (below, the conveyance direction of circuit board 12 by conveyor 13 is referred to as the X direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction (positioned perpendicular to the X direction) along guide rail 16 by a screw mechanism (not shown) or the like such that the width of conveyor 13 (the gap between conveyor rails 13a and 13b) is adjustable to the width of circuit board 12.

Also, tray feeder 20 is set to the side of conveyor 13. Magazine 21 that is raised and lowered by a raising and lowering mechanism (not shown) is provided inside tray feeder 20, and pallets 23 on each of which are loaded a tray 22 are stored in multiple levels of slots in magazine 21. Multiple rows of multiple cavities in each of which a component is loaded are formed in each tray 22.

Pallet forwarding table 27, which moves pallet 23 (tray) that has been pulled from magazine 21 by a pallet forwarding mechanism (not shown) to the component pickup station of component mounter 10, is provided at the rear side of tray feeder 20 (the conveyor 13 side).

Head moving mechanism 25, which moves rotary head 24 in the XY directions between the component pickup station (above pallet forwarding table 27) at which component pickup operation is performed and the component mounting station (above conveyor 13) at which component mounting operation is performed, is attached to component mounter 10. A specified quantity of suction nozzles 26, which pick up components loaded on tray 22 that is on pallet 23 that is pulled forward on pallet forwarding table 27 of tray feeder 20, are held on rotary head 24 at a specified interval (uniform pitch) in a circumferential direction.

Rotary head 24 is provided with head rotating mechanism 31 that revolves the specified quantity of suction nozzles 26 in a circumferential direction of rotary head 24 by rotating (on its own axis) rotary head 24 around its own central axis (R axis), Z-axis drive mechanisms (Z1-axis drive mechanism 32a and Z2-axis drive mechanism 32b, which are described later) that cause suction nozzle 26 to pick up a component by lowering the suction nozzle 26 at a specified stopping position (above the component pickup position on tray 22) on the revolution path of the suction nozzles 26, and nozzle rotating mechanism 33 that corrects the direction of a component picked up by suction nozzle 26 by rotating (on its own axis) suction nozzle 26 around its own center axis.

Figure 3:
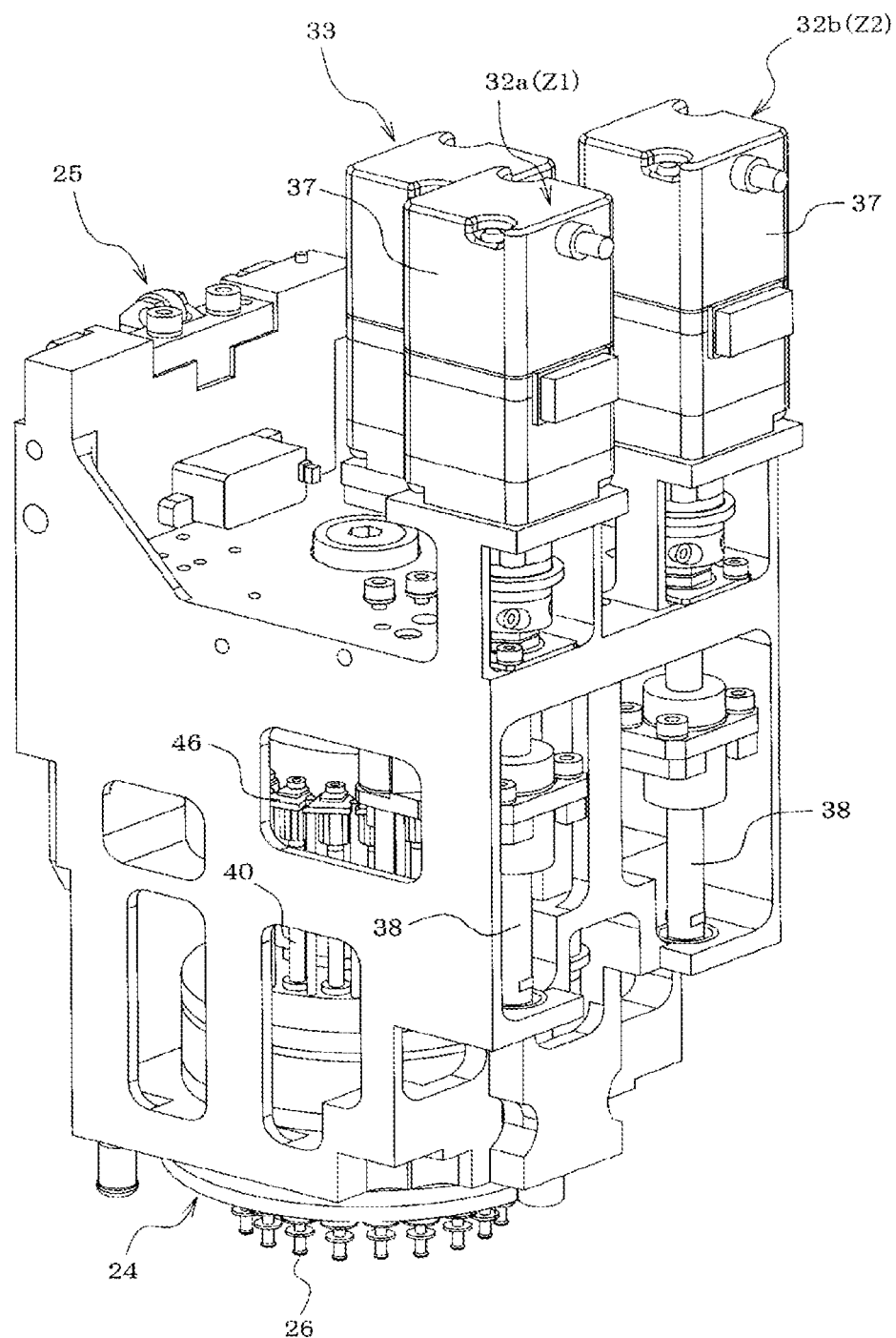
FIG. 3 is a perspective view of an entire rotary head.
Figure 4:
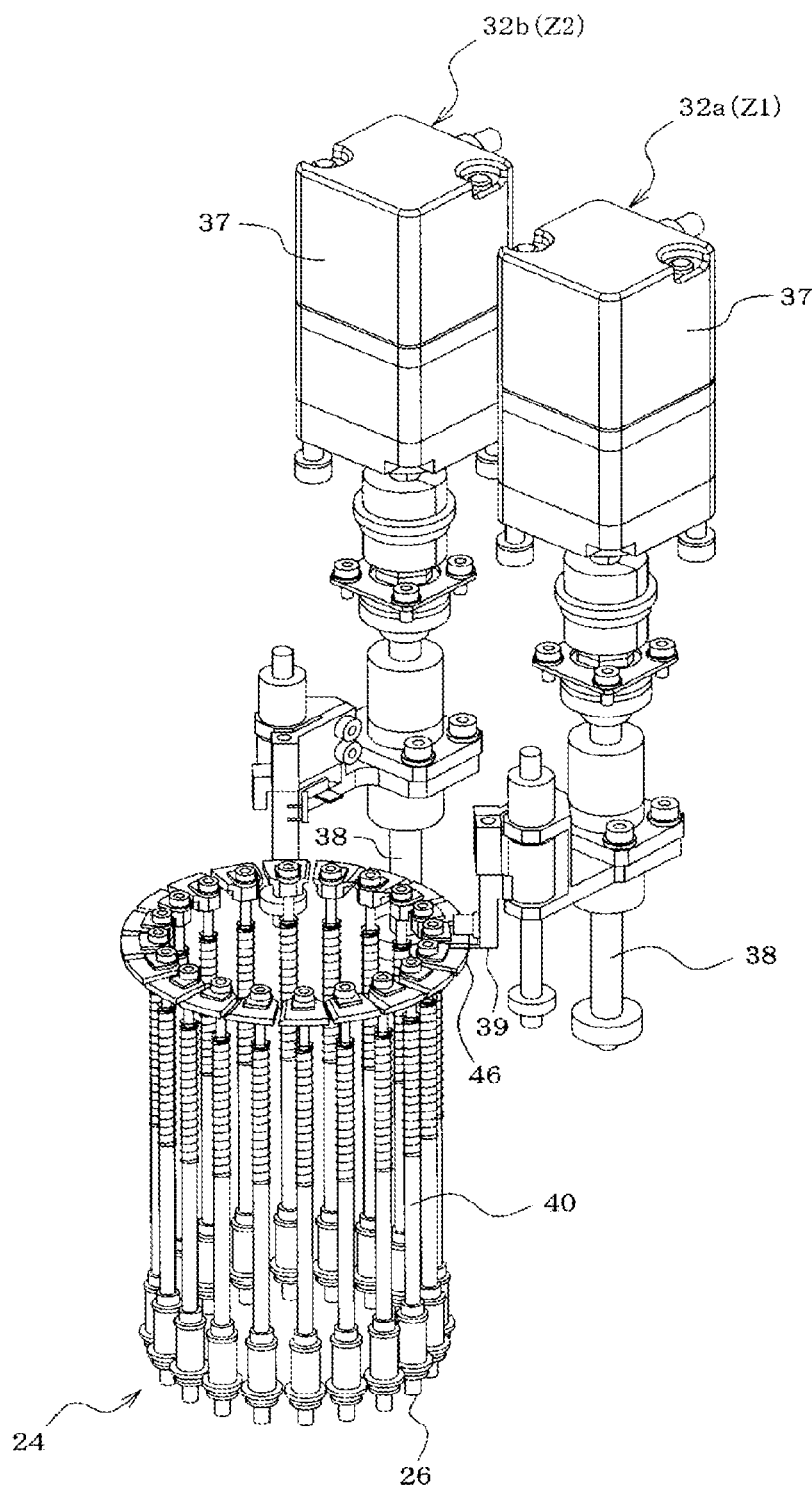
FIG. 4 is a perspective view showing the positional relationship between the Z1-axis and Z2-axis drive mechanisms and the nozzle holders (suction nozzles) of the rotary head.
Figure 5:
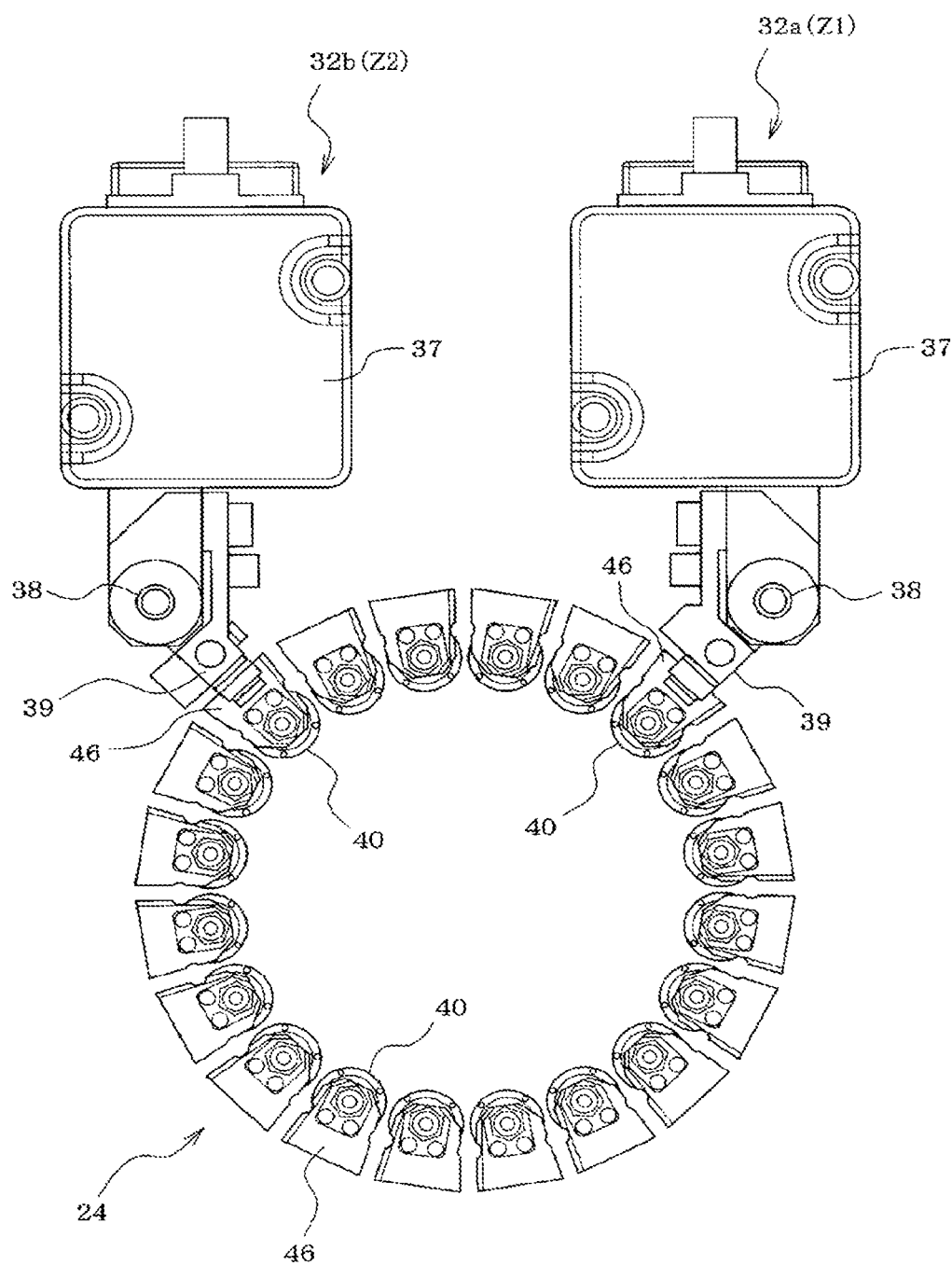
FIG. 5 is a plan view showing the positional relationship between the Z1-axis and Z2-axis drive mechanisms and the nozzle holders of the rotary head.

In the present embodiment, as shown in FIGS. 3 to 5, two Z-axis drive mechanisms, Z1-axis drive mechanism 32*a* and Z2-axis drive mechanism 32*b*, are provided at two locations surrounding rotary head 24, with two components on tray 22 being able to be simultaneously picked up by two suction nozzles 26 by the suction nozzles 26 being lowered simultaneously by Z1-axis drive mechanism 32*a* and Z2-axis drive mechanism 32*b*.

Z1-axis drive mechanism 32*a* and Z2-axis drive mechanism 32*b* each use Z-axis motor 37 as an actuator, and by screw 38 being rotated by this Z-axis motor 37 such that Z-axis slide 39 is moved up and down, Z-axis slide 39 engages with engaging member 46 provided at the top end of nozzle holder 40 of rotary head 24, which raises and lowers nozzle holder 40, thus raising and lowering suction nozzle 26 held on the lower section of the nozzle holder 40. The position in the XY directions (horizontal directions) of Z-axis slide 39 of Z1-axis drive mechanism 32*a* and Z2-axis drive mechanism 32*b* is configured such that the position in the Y direction is the same, thus, even if rotary head 24 is rotated, the position in the XY directions of Z-axis slide 39 is maintained at a regular position. Note that, Z-axis slide 39 may be moved up and down by a linear motor acting as Z-axis motor 37. Alternatively, instead of a linear motor, a linear solenoid, an air cylinder, or the like may be used.

Also, component mounter 10 is provided with mark camera 35 (camera for imaging marks) that images reference position marks of circuit board 12 from above by being moved as one with rotary head 24, and component camera 36 (camera for imaging components) that images a component picked up by suction nozzle 26 from below.

Connected to control device 41 of component mounter 10 are, for example, input device 42 such as a keyboard, mouse, or touchscreen panel; memory device 43 (memory device) including a hard disk, RAM, ROM and so on for memorizing various types of programs, data, and the like; and display device 44 such as a liquid crystal display or CRT.

Figure 7:
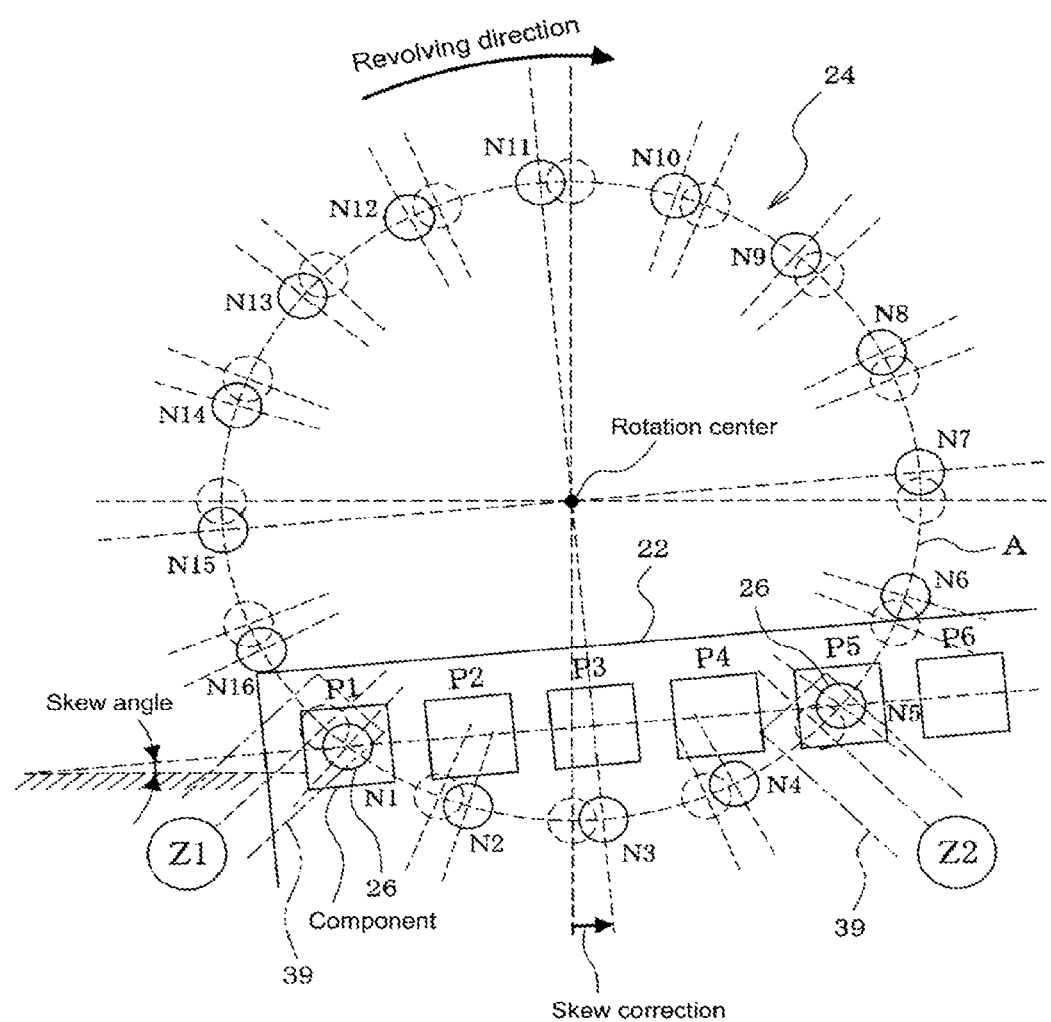
FIG. 7 is a plan view for illustrating operation for correcting the deviation in the component pickup position due to skewed arrangement of the components on the tray during simultaneous pickup mode.

Further, control device 41 of component mounter 10 functions as an image recognizing device that recognizes the component by image processing an image of the component on tray captured by mark camera 35, as a component arrangement skew angle measuring device that measures the arrangement skew angle (refer to FIG. 7) of components on tray 22 based on the recognition result, and as component pickup position correcting device that corrects the component pickup position on tray 22 based on the measured arrangement skew angle of the components (skew angle of tray 22). Also, control device 41 (control device) of component mounter 10 performs component pickup operation after correcting the position of suction nozzle 26 by rotating rotary head 24 using head rotating mechanism 31, as shown in FIG. 7, according to the component pickup position corrected for the arrangement skew angle of components on tray 22. In this manner, in a case in which tray 22 is set in a skewed manner and the arrangement of the components on tray 22 is skewed, it is possible to correct the pickup position of the components on tray 22 according to the skew angle, and thus it is possible to prevent a component pickup problem or component pickup orientation error (such as a tombstoned pickup or slanted pickup) caused by a skewed arrangement of components on tray 22.

During operation of component mounter 10, operation is repeated such that, after component pickup operation has been performed by moving rotary head 24 to the component pickup station using head moving mechanism 25, component mounting operation is performed by moving rotary head 24 to the component mounting station and mounting the component on circuit board 12.

In the present embodiment, the configuration is such that it is possible to select from, as component pickup operation control modes, a simultaneous pickup mode in which two suction nozzles 26 are lowered simultaneously such that two components on tray 22 are picked up simultaneously, and an individual pickup mode in which the suction nozzles 26 of rotary head 24 are lowered one by one in a specified order so as to pick up components on tray 22 one by one, and control device 41 of component mounter 10 selects the simultaneous pickup mode such that two components on tray 22 are picked up simultaneously in a case in which it is determined that simultaneous pickup of two components on tray 22 is possible, and selects the individual pickup mode such that suction nozzles 26 of rotary head 24 are lowered one by one in the specified order so as to pick up components on tray 22 one by one in a case in which it is determined that simultaneous pickup of multiple components on tray 22 is not possible. The two component pickup operation control modes are described below referring to FIGS. 6 to 11.

Simultaneous Pickup Mode

Figure 6:
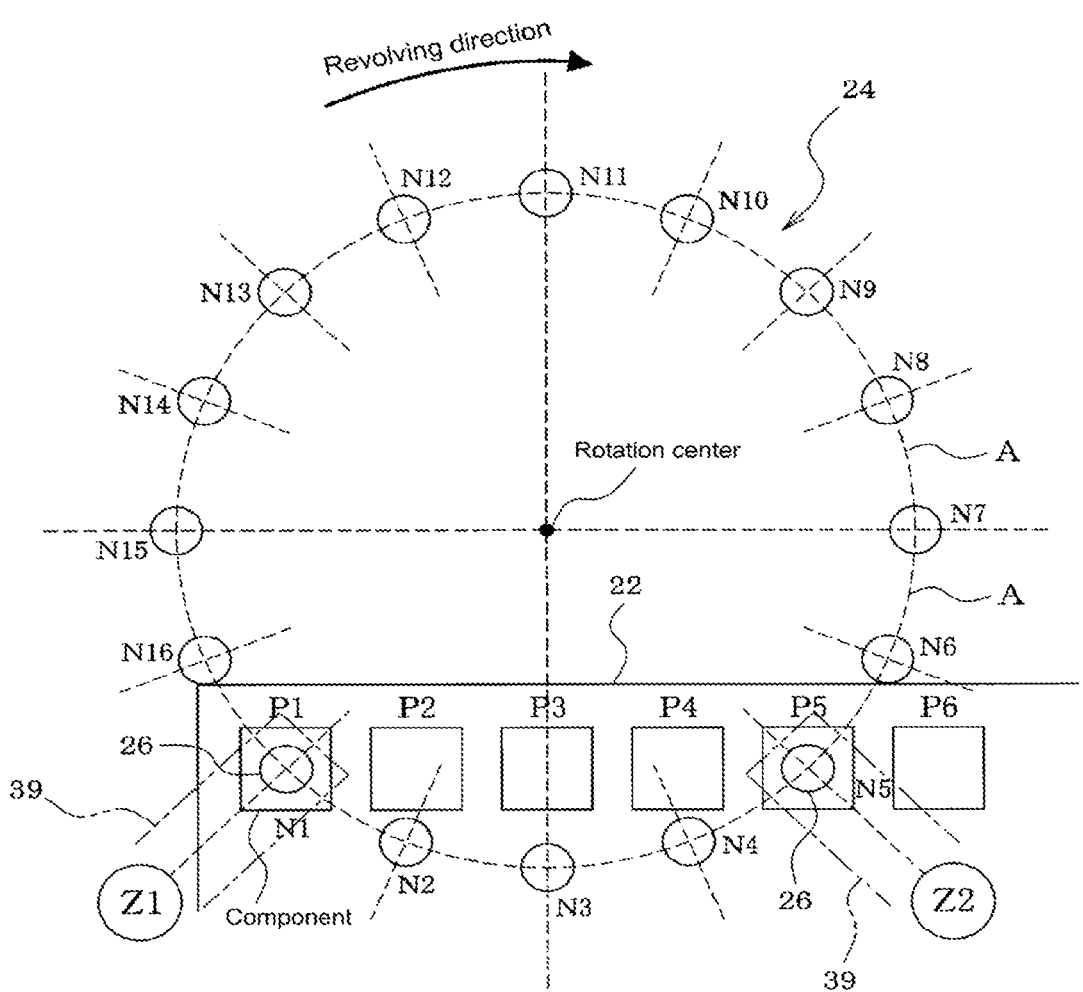
FIG. 6 is a plan view showing the positional relationship between the arrangement of the suction nozzles of the rotary head and the arrangement of the components on the tray during simultaneous pickup mode.
Figure 8:
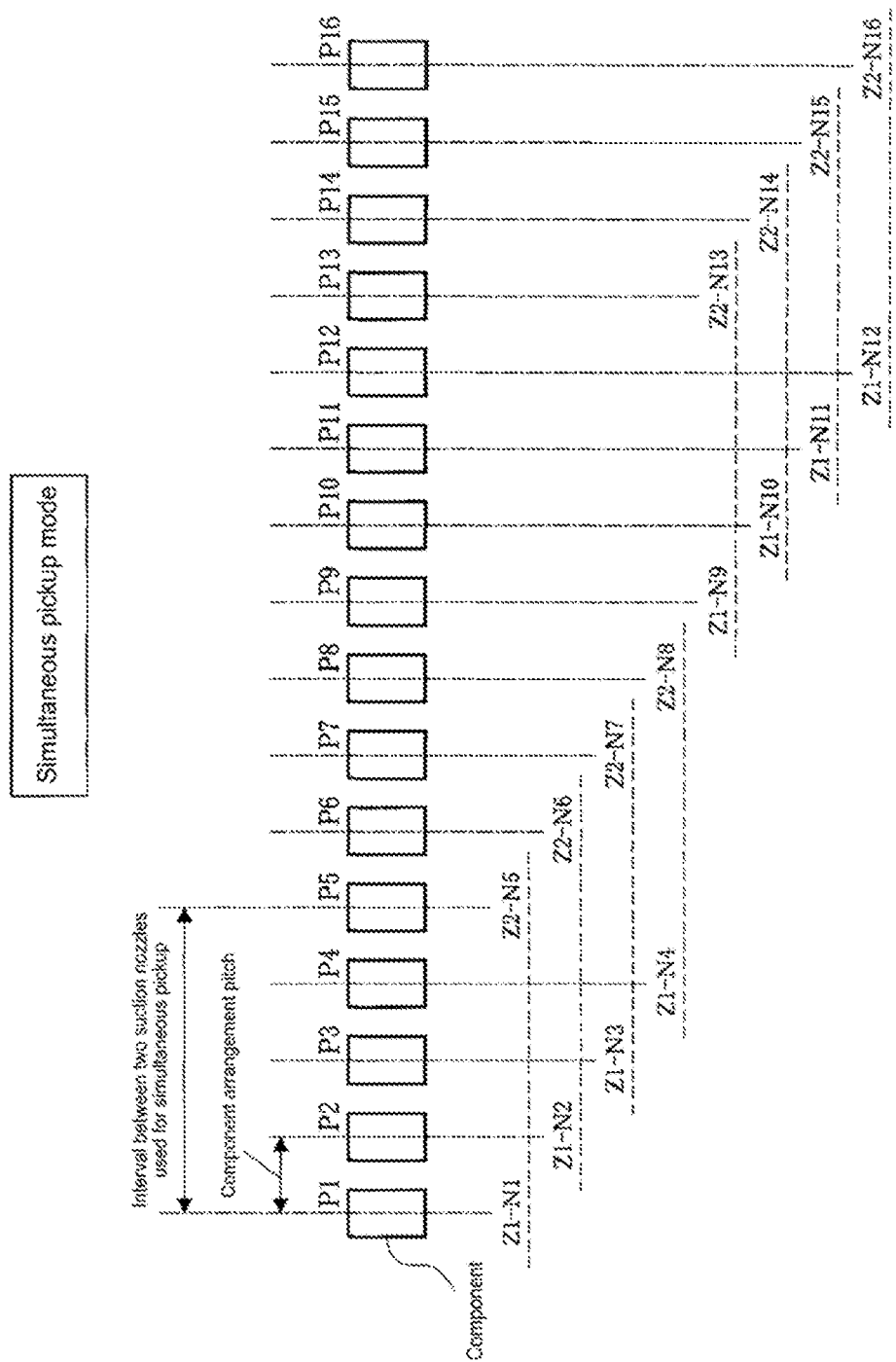
FIG. 8 illustrates an example of the component pickup order in a case in which the interval between the two suction nozzles used to perform simultaneous pickup is a multiple of twice or greater than the arrangement pitch of the components on the tray during simultaneous pickup mode.

First, simultaneous pickup mode is described referring to FIGS. 6 to 8. Simultaneous pickup mode is a component pickup operation control mode used in a case in which the interval (distance in a straight line between the nozzle centers) between two suction nozzles 26 used to perform simultaneous pickup of two components on tray 22 is a multiple of the arrangement pitch of components on tray 22. Control device 41 of component mounter 10, before starting component pickup operation, recognizes components on tray 22 by image processing the components imaged by mark camera 35, and measuring the arrangement skew angle (refer to FIG. 7) of the components on tray 22 based on the recognition result. Note that, in a case in which a reference mark is provided on tray 22, the skew angle of tray 22 may be measured based on a recognition result of the imaged reference mark. The component pickup position on tray 22 is corrected according to the measured arrangement skew angle of the components on tray 22 (tray 22 skew angle), then, according to the corrected component pickup position, as shown in FIG. 7, rotary head 24 is rotated by head rotating mechanism 31, and the positions of the two suction nozzles 26 are corrected to the stable pickup positions (position at which stable pickup of the component is possible, usually the component center or component center of gravity) of the two components. In this case, in a case in which it is not possible to correct the positions of the two suction nozzles 26 to the stable pickup positions of the two components with only rotation operation of rotary head 24, rotary head 24 is moved in the XY directions by head moving mechanism 25 and rotary head 24 is rotated such that the revolving circular path A of suction nozzles 26 of rotary head 24 coincides with the stable pickup positions of the two components to be picked up simultaneously, and the positions of the two suction nozzles 26 are corrected to the stable pickup positions of the two components.

Control device 41 of component mounter 10, in a case in which the interval between the two suction nozzles 26 used for simultaneous pickup is a multiple that is two times or greater than the arrangement pitch of the components on tray 22, after performing consecutive simultaneous pickup operation repeatedly for a quantity corresponding to the quantity of component arrangement pitches between the two suction nozzles 26, the consecutive simultaneous pickup operation being that of lowering the two suction nozzles 26 simultaneously such that two of the components on tray 22 are picked up simultaneously, then rotating rotary head 24 by one nozzle pitch using head rotating mechanism 31, moving rotary head 24 in the arrangement direction of the components on tray 22 by one component arrangement pitch using head moving mechanism 25, and then lowering the next two suction nozzles 26 simultaneously such that another two of the components on tray 22 are picked up simultaneously, repeats operation of moving rotary head 24 in the arrangement direction of the components on tray 22 by the interval between the two suction nozzles 26+one component arrangement pitch, and rotating rotary head 24 before the next two suction nozzles 26 have been moved above another two of the components on tray 22. Accordingly, it is possible to shorten the moving distance of rotary head 24 during component pickup operation, contributing to faster component pickup operation.

With the example configuration shown in FIGS. 6 to 8, the interval between the two suction nozzles 26 used for simultaneous pickup is four times the component arrangement pitch. A total of sixteen suction nozzles 26 are held on rotary head 24 arranged at a pitch of 22.5 degrees in a circumferential direction. Thus, one nozzle pitch is 22.5 degrees. Note that, in FIG. 8, "Z1-N1" means first suction nozzle 26 (N1) lowered by Z1-axis drive mechanism 32a, "Z1-N2" means second suction nozzle 26 (N2) lowered by Z1-axis drive mechanism 32a, "Z1-N3" means third suction nozzle 26 (N3) lowered by Z1-axis drive mechanism 32a (and so on). Also, "Z2-N5" means fifth suction nozzle 26 (N5) lowered by Z2-axis drive mechanism 32b, "Z2-N6" means sixth suction nozzle 26 (N6) lowered by Z2-axis drive mechanism 32b, "Z2-N7" means seventh suction nozzle 26 (N7) lowered by Z2-axis drive mechanism 32b (and so on).

Here, first, among components arranged on tray 22 (P1, P2, . . . ), the first and fifth suction nozzles 26 (N1 and N5) are positioned above the first and fifth components (P1 and P5), and the first and fifth suction nozzles 26 (N1 and N5) are lowered simultaneously by Z1-axis drive mechanism 32a and Z2-axis drive mechanism 32b so as to pick up the first and fifth components (P1 and P5) simultaneously.

Then, rotary head 24 is rotated by head rotating mechanism 31 by one nozzle pitch (22.5 degrees), rotary head 24 is moved by head moving mechanism 25 by one component arrangement pitch in the arrangement direction of components on tray 22 such that the second and sixth suction nozzles 26 (N2 and N6) are above the second and sixth components (P2 and P6), and the second and sixth suction nozzles 26 (N2 and N6) are lowered simultaneously by Z1-axis drive mechanism 32a and Z2-axis drive mechanism 32b so as to pick up the second and sixth components (P2 and P6) simultaneously. When this simultaneous pickup operation has been repeated four times, that is the quantity corresponding to the quantity of component arrangement pitches between the two suction nozzles 26, among the components arranged on tray 22 (P1, P2, . . . ), the first to eighth components (P1 to P8) have been picked up by eight suction nozzles 26 (N1 to N8) of rotary head 24.

Then, rotary head 24 is moved in the arrangement direction of the components on tray 22 by five component arrangement pitches, that is by the interval between two suction nozzles 26+one component arrangement pitch, rotary head 24 is rotated by head rotating mechanism 31 by five nozzles pitches (22.5 degrees×5=112.5 degrees) such that the ninth and thirteenth suction nozzles 26 (N9 and N13) are above the ninth and thirteenth components (P9 and P13), and the ninth and thirteenth suction nozzles 26 (N9 and N13) are lowered simultaneously by Z1-axis drive mechanism 32a and Z2-axis drive mechanism 32b so as to pick up the ninth and thirteenth components (P9 and P13) simultaneously.

Then, rotary head 24 is rotated by head rotating mechanism 31 by one nozzle pitch (22.5 degrees), rotary head 24 is moved by head moving mechanism 25 by one component arrangement pitch in the arrangement direction of components on tray 22 such that the tenth and fourteenth suction nozzles 26 (N10 and N14) are above the tenth and fourteenth components (P10 and P14), and the tenth and fourteenth suction nozzles 26 (N10 and N14) are lowered simultaneously by Z1-axis drive mechanism 32a and Z2-axis drive mechanism 32b so as to pick up the tenth and fourteenth components (P10 and P14) simultaneously.

When this simultaneous pickup operation has been repeated four times, that is the quantity corresponding to the quantity of component arrangement pitches between the two suction nozzles 26, among the components arranged on tray 22 (P1, P2, . . . ), the ninth to sixteenth components (P9 to P16) have been picked up by eight suction nozzles 26 (N9 to N16) of rotary head 24. By this, components (P1 to P16) have been picked up by all sixteen suction nozzles 26 (N1 to N16) of rotary head 24 and component pickup operation is complete. After this, rotary head 24 is moved by head moving mechanism 25 to the component mounting station, and the component mounting operation of mounting the components on circuit board 12 is performed. Accordingly, it is possible to shorten the moving distance of rotary head 24 during component pickup operation, contributing to faster component pickup operation.

Figure 9:
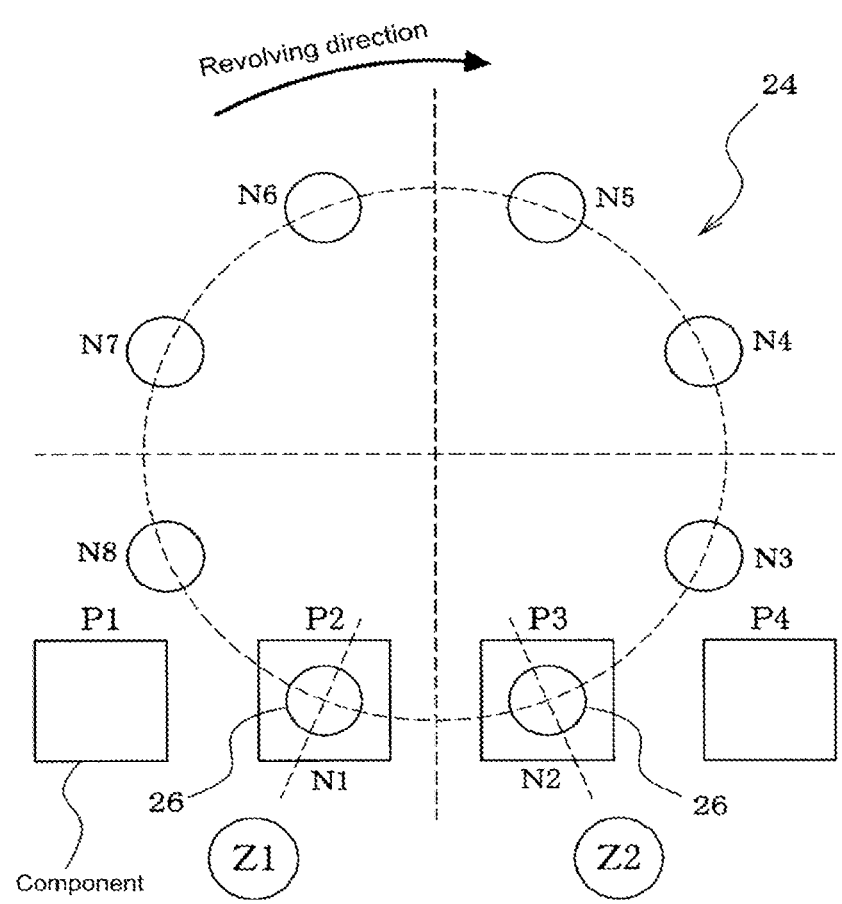
FIG. 9 is a plan view showing the positional relationship the arrangement of the suction nozzles of the rotary head and the arrangement of the components on the tray in a case in which the interval between the two suction nozzles used to perform simultaneous pickup is the same as the arrangement pitch of the components on the tray.
Figure 10:
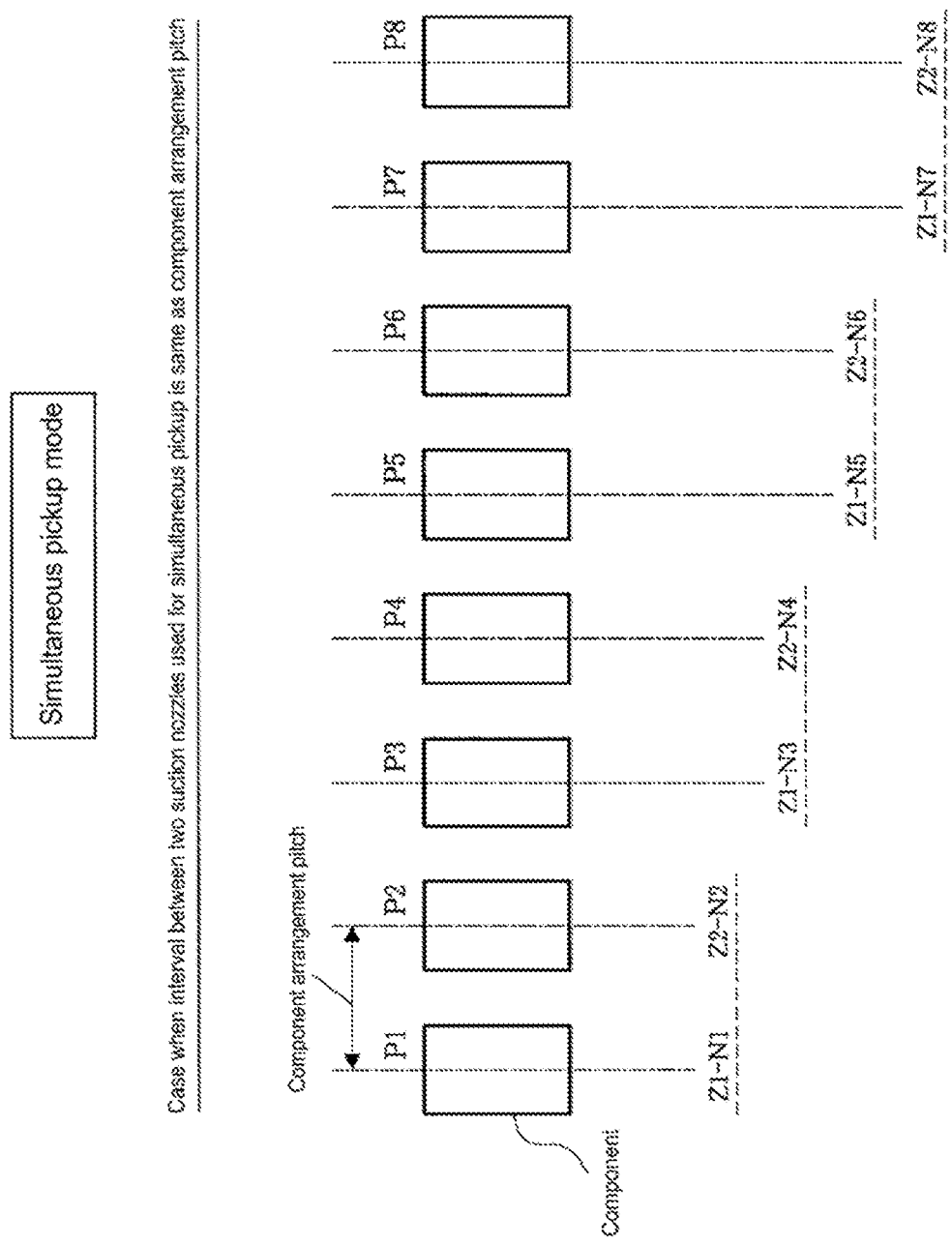
FIG. 10 illustrates an example of the component pickup order in a case in which the interval between the two suction nozzles used to perform simultaneous pickup is the same as the arrangement pitch of the components on the tray during simultaneous pickup mode.

Further, control device 41 of component mounter 10, as shown in FIGS. 9 to 10, in a case in which the interval between the two suction nozzles 26 used to perform simultaneous pickup is the same as the arrangement pitch of the components on tray 22, repeats operation of picking up two of the components on tray 22 simultaneously using two suction nozzles 26, then rotating rotary head 24 by two nozzle pitches using head rotating mechanism 31, moving rotary head 24 in the arrangement direction of the components on tray 22 by two component arrangement pitches using rotary head moving mechanism 26, and lowering the next two suction nozzles 26 such that two other of the components on tray 22 are picked up.

In the example configuration of FIGS. 8 to 10, a total of eight suction nozzles 26 (N1 to N8) are held on rotary head 24 arranged at a pitch of 45 degrees in a circumferential direction. Thus, one nozzle pitch is 45 degrees. Note that, in FIG. 10, "Z1-N1" means first suction nozzle 26 (N1) lowered by Z1-axis drive mechanism 32a, "Z1-N3" means third suction nozzle 26 (N3) lowered by Z1-axis drive mechanism 32a, "Z1-N5" means fifth suction nozzle 26 (N5) lowered by Z1-axis drive mechanism 32a, and "Z1-N7" means seventh suction nozzle 26 (N7) lowered by Z1-axis drive mechanism 32a. Also, "Z2-N2" means second suction nozzle 26 (N2) lowered by Z2-axis drive mechanism 32b, "Z2-N4" means fourth suction nozzle 26 (N4) lowered by Z2-axis drive mechanism 32b, "Z2-N6" means sixth suction nozzle 26 (N6) lowered by Z2-axis drive mechanism 32b, and "Z2-N8" means eighth suction nozzle 26 (N8) lowered by Z2-axis drive mechanism 32b.

Individual Pickup Mode

Figure 11:
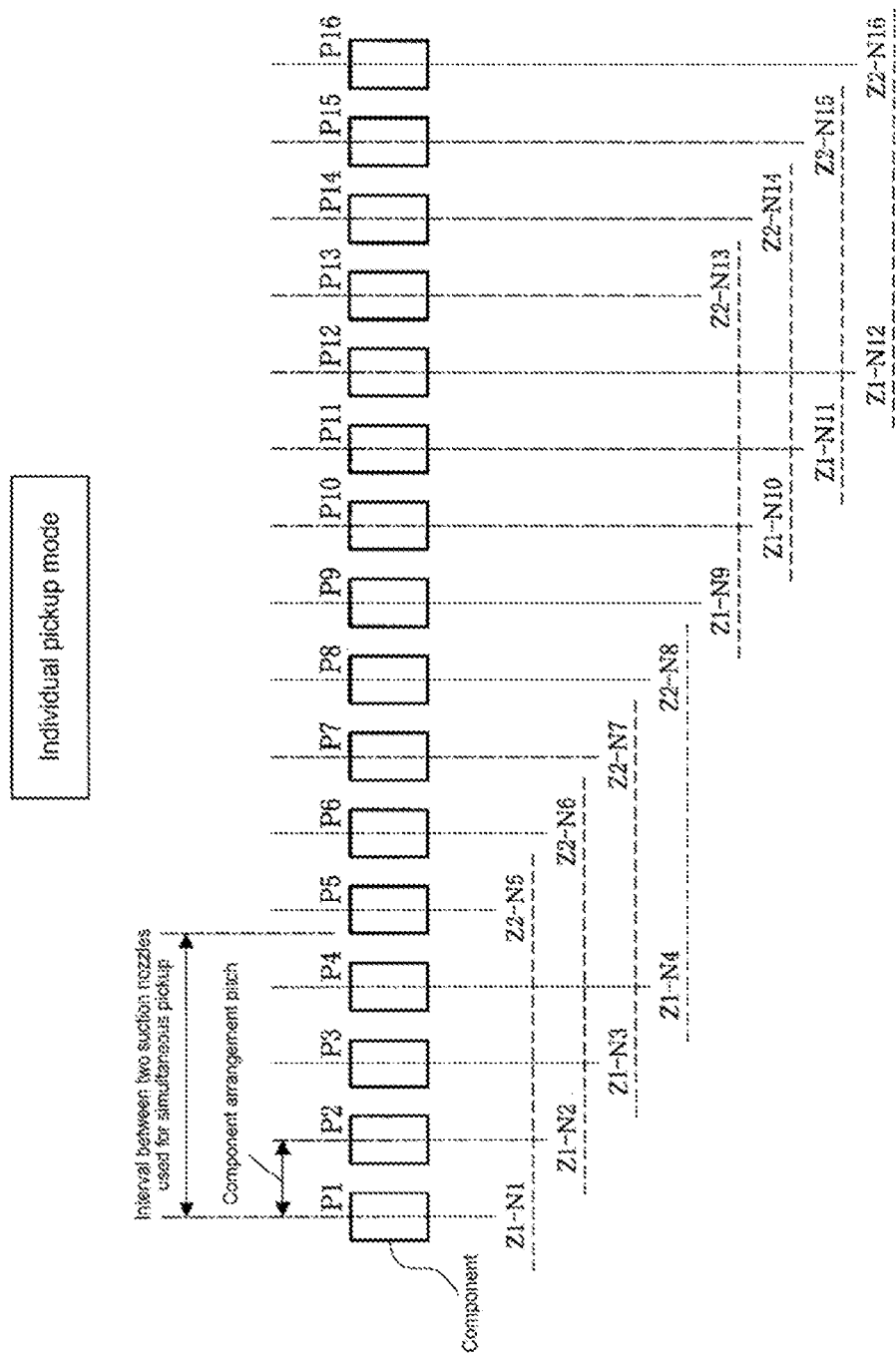
FIG. 11 illustrates an example of the component pickup order during individual pickup mode.

Next, individual pickup mode is described referring to FIG. 11. In the example of FIG. 11, in a similar manner to FIGS. 6 to 8, a total of sixteen suction nozzles 26 (N1 to N16) are held on rotary head 24 arranged at a pitch of 22.5 degrees in a circumferential direction.

Individual pickup mode is a component pickup operation control mode performed in a case in which two components on tray 22 cannot be picked up simultaneously. Switching between simultaneous pickup mode and individual pickup mode may be performed by an operator operating input device 42, or may be performed automatically. In an automatic case, control device 41 of component mounter 10 may determine whether simultaneous pickup of two components on tray 22 is possible based on the relationship between the arrangement pitch of components on tray 22 specified in a production job or the like and the positions of suction nozzles 26 of rotary head 24.

The example in FIG. 11 shows one component pickup order of individual pickup mode in a case in which the interval between the two suction nozzles 26 to be lowered by Z1-axis drive mechanism 32a and Z2-axis drive mechanism 32b is different to a multiple of the arrangement pitch of components on tray 22. In this case, first, the positions of first and fifth suction nozzles 26 (N1 and N5) are arranged in the arrangement direction of components on tray 22, the position of the first suction nozzle 26 (N1 ) to be lowered by Z1-axis drive mechanism 32a is moved above the first component (P1) of tray 22, and the first suction nozzle 26 (N1) only is lowered such that the first component (P1) is picked up.

Then, rotary head 24 is moved slightly in the arrangement direction of components on tray 22, the position of fifth suction nozzle 26 (N5) to be lowered by Z2-axis drive mechanism 32b is moved above the fifth component (P5), and the fifth suction nozzle 26 (N5) is lowered such that the fifth component (P5) is picked up.

After this, rotary head 24 is rotated by one nozzle pitch (22.5 degrees), the positions of second and sixth suction nozzles 26 (N2 and N6) are arranged in the arrangement direction of components on tray 22, rotary head 24 is moved in the arrangement direction of components on tray 22, the position of the second suction nozzle 26 (N2) to be lowered by Z1-axis drive mechanism 32a is moved above the second component (P2) of tray 22, and the second suction nozzle 26 (N2) is lowered such that the second component (P2) is picked up.

Then, rotary head 24 is moved slightly in the arrangement direction of components on tray 22, the position of sixth suction nozzle 26 (N6) to be lowered by Z2-axis drive mechanism 32b is moved above sixth component (P6) of tray 22, and the sixth suction nozzle 26 (N6) is lowered such that the sixth component (P6) is picked up. Hereafter, similar operations are repeated such that the first to eighth components (P1 to P8) have been picked up by eight suction nozzles 26 (N1 to N8) of rotary head 24.

Then, rotary head 24 is rotated by head rotating mechanism 31 by five nozzle pitches (22.5 degrees×5=112.5 degrees), the position of ninth suction nozzle 26 (N9) is moved above the ninth component (P9) of tray 22, and the ninth suction nozzle 26 (N9) only is lowered such that the ninth component (P9) is picked up. Then, rotary head 24 is moved slightly in the arrangement direction of components on tray 22, the position of thirteenth suction nozzle 26 (N13) to be lowered by Z2-axis drive mechanism 32b is moved above the thirteenth component (P13), and the thirteenth suction nozzle 26 (N13) is lowered such that the thirteenth component (P13) is picked up.

Subsequently, similar operations are repeated such that lowering of all sixteen suction nozzles 26 (N1 to N16) of rotary head 24 is performed in a specified order to repeat one by one pickup operation, and when components (P1 to P16) have been picked up by all sixteen suction nozzles 26 (N1 to N16), component pickup operation is complete. After this, rotary head 24 is moved by head moving mechanism 25 to the component mounting station, and the component mounting operation of mounting the components on circuit board 12 is performed.

Note that, in the above simultaneous pickup mode, the component pickup order in a case in which the interval between the two suction nozzles 26 used to perform simultaneous pickup is the same as the arrangement pitch of the components on tray 22, is the same as the component pickup order of individual pickup mode shown in FIG. 11, the only difference being components are picked up one by one.

Note that, if large components are picked up by adjacent nozzles 26, the components may interfere with each other. In this case, for example, only odd numbered nozzles 26 (N1, N3, N5, . . . ) may pick up components, lowering may be only performed by Z1-axis drive mechanism 32a, such that components are picked up individually by the odd numbered nozzles 26.

According to the above embodiment, the configuration is such that it is possible to select from a simultaneous pickup mode in which two suction nozzles 26 are lowered simultaneously such that two components on tray 22 are picked up simultaneously, and an individual pickup mode in which the suction nozzles 26 of rotary head 26 are lowered one by one in a specified order so as to pick up components on tray 22 one by one, the simultaneous pickup mode is selected such that two components on tray 22 are picked up simultaneously in a case in which it is determined that simultaneous pickup of two components on tray 22 is possible, and the individual pickup mode is selected such that suction nozzles 26 of rotary head 24 are lowered one by one in the specified order so as to pick up components on tray 22 one by one in a case in which it is determined that simultaneous pickup of multiple components on tray 22 is not possible, therefore it is possible to use trays 22 of various component types with different arrangement pitches.

Further, two Z-axis drive mechanisms, Z1-axis drive mechanism 32a and Z2-axis drive mechanism 32b, are provided at two locations surrounding rotary head 24, such that two components on tray 22 are able to be simultaneously picked up during simultaneous pickup mode by the two suction nozzles 26 being lowered, therefore, compared to the configurations of patent literature 1 and 2, it is possible to pick up two components from tray 22 supplied by tray feeder 24 using rotary head 24 with a conventional configuration without requiring a more complex rotary head 24 configuration for performing simultaneous pickup operation.

Note that, the present disclosure is not limited to the configuration of the above embodiments, and various changes may be made without departing from the scope, such as, the configuration may be such that during simultaneous pickup mode, three or more suction nozzles 26 are lowered simultaneously such that three or more components are picked up simultaneously, or the quantity of suction nozzles 26 may be changed.

REFERENCE SIGNS LIST

10: rotary head type component mounter; 12: circuit board; 13: conveyor; 20: tray feeder; 21: magazine; 22: tray; 23: pallet; 24: rotary head; 25: head moving mechanism; 26: suction nozzle; 27: pallet forwarding table; 31: head rotating mechanism; 32a: Z1-axis drive mechanism (Z-axis drive mechanism); 33: nozzle rotating mechanism; 27: Z-axis motor; 39: Z-axis slide; 40: nozzle holder; 41: control device (control device, image recognizing device, component arrangement skew angle measuring device, component pickup position correcting device); 43: memory device (memorizing device); 46: engaging member

The invention claimed is:

1. A rotary head type component mounter comprising:
a tray feeder configured to supply a tray loaded with components;
a rotary head configured to hold suction nozzles separated in a circumferential direction by a specified nozzle pitch;
a head rotating mechanism configured to revolve the suction nozzles in a rotating direction of the rotary head by rotating the rotary head;
a first Z-axis drive mechanism configured to lower a first suction nozzle of the suction nozzles relative to the rotary head positioned above the tray such that the first suction nozzle picks up a first component on the tray;
a second Z-axis drive mechanism configured to lower a second suction nozzle of the suction nozzles relative to the rotary head positioned above the tray such that the second suction nozzle picks up a first component on the tray;
a head moving mechanism configured to move the rotary head in an XY direction between a component pickup station at which component pickup is performed and a component mounting station at which component mounting is performed; and
a control device configured to control operation of the head rotating mechanism, the first Z-axis drive mechanism, the second Z-axis drive mechanism, and the head moving mechanism;
wherein the control device is configured to simultaneously lower the first suction nozzle and the second suction nozzle positioned above the tray using the first Z-axis drive mechanism and the second Z-axis drive mechanism such that the first component and the second component on the tray are picked up simultaneously.

2. The rotary head type component mounter according to claim 1, further comprising:
an image recognizing device configured to recognize the components by image processing an image captured of the components on the tray;
a component arrangement skew angle measuring device configured to measure an arrangement skew angle of the components on the tray based on a recognition result of the image recognizing device; and
a component pickup position correcting device configured to correct a pickup position of the components on the tray according to the arrangement skew angle of the component on the tray measured by the component arrangement skew angle measuring device,
wherein the control device is configured to perform component pickup operation after correcting the position of the suction nozzle by performing rotation operation of the rotary head using the head rotating mechanism according to the component pickup position corrected by the component pickup position correcting device.

3. The rotary head type component mounter according to claim 1, wherein an interval between the first suction nozzle and the second suction nozzle is a multiple of an arrangement pitch of the components on the tray, and
the control device
(1) in a case in which the interval between the first suction nozzle and the second suction nozzle is a multiple that is two times or greater than the arrangement pitch of the components on the tray, after performing consecutive simultaneous pickup operation repeatedly for a quantity corresponding to the quantity of component arrangement pitches between the first suction nozzle and the second suction nozzle, the consecutive simultaneous pickup operation being that of
lowering the first suction nozzle and the second suction nozzle simultaneously such that the first component and the second component on the tray are picked up simultaneously,
then rotating the rotary head by one nozzle pitch using the head rotating mechanism, moving the rotary head in the arrangement direction of the components on the tray by one component arrangement pitch using the head moving mechanism, and
then lowering next two suction nozzles simultaneously such that another two of the components on the tray are picked up simultaneously,
repeats operation of moving the rotary head in the arrangement direction of the components on the tray by the interval between the first suction nozzle and the second suction nozzle plus one component arrangement pitch, and rotating the rotary head before the next two suction nozzles have been moved above the another two of the components on the tray; and
(2) in a case in which the interval between the two suction nozzles is the same as the arrangement pitch of the components on the tray, repeats operation of
lowering the first suction nozzle and the second suction nozzle simultaneously such that the first component and the second component on the tray are picked up simultaneously,
then rotating the rotary head by two nozzle pitches using the head rotating mechanism,
moving the rotary head in the arrangement direction of the components on the tray by the two component arrangement pitches using the rotary head moving mechanism, and
lowering next two suction nozzles such that two other of the components on the tray are picked up.

4. The rotary head type component mounting according to claim 1, configured to be able to select from
a simultaneous pickup mode in which multiple suction nozzles are lowered simultaneously such that multiple of the components on the tray are picked up simultaneously, and
an individual pickup mode in which the suction nozzles of the rotary head are lowered in a specified order so as to pick up components on the tray one by one.

* * * * *